(12) United States Patent
Kinoshita

(10) Patent No.: US 6,564,991 B1
(45) Date of Patent: May 20, 2003

(54) BALL MOUNT APPARATUS AND MOUNT METHOD

(75) Inventor: Satoshi Kinoshita, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/630,408

(22) Filed: Aug. 1, 2000

(30) Foreign Application Priority Data

Aug. 4, 1999 (JP) ........................................ P. 11-220729

(51) Int. Cl.⁷ ............................................... B23K 31/12
(52) U.S. Cl. ........................................ 228/245; 228/103
(58) Field of Search .............................. 228/180.1, 254, 228/105, 56.5, 246, 41, 103; 29/741, 740, 743; 438/613, 615; 257/737, 738; 219/85.19, 85.22

(56) References Cited

U.S. PATENT DOCUMENTS

| | | | |
|---|---|---|---|
| 5,467,913 A | * 11/1995 | Namekawa et al. | |
| 5,540,377 A | * 7/1996 | Ito | |
| 5,601,229 A | 2/1997 | Nakazato et al. | 288/246 |
| 5,615,823 A | 4/1997 | Noda et al. | 228/103 |
| 5,695,667 A | * 12/1997 | Eguchi et al. | |
| 5,742,048 A | 4/1998 | Kobayashi et al. | 250/222.1 |
| 5,831,247 A | 11/1998 | Hidaka | 219/388 |
| 5,839,191 A | * 11/1998 | Economy et al. | |
| 5,867,260 A | * 2/1999 | Sakai | |
| 5,899,737 A | * 5/1999 | Trabucco | |
| 5,943,125 A | * 8/1999 | King et al. | |
| 6,046,076 A | * 4/2000 | Mitchell et al. | |
| 6,070,783 A | * 6/2000 | Nakazato | |
| 6,075,883 A | * 6/2000 | Stern et al. | |
| 6,118,540 A | * 9/2000 | Roy et al. | |
| 6,237,219 B1 | * 5/2001 | Arikado et al. | |

* cited by examiner

Primary Examiner—Tom Dunn
Assistant Examiner—Jonathan Johnson
(74) Attorney, Agent, or Firm—Sughrue Mion, PLLC

(57) ABSTRACT

A work conveying path is provided in the longitudinal direction of a work on which balls are to be mounted. A ball supply tray for supplying balls and a mount head are disposed so that their longitudinal directions substantially coincide with the longitudinal direction of the work. Further, a ball inspection unit for inspecting balls sucked on the mount head is disposed so that the projecting direction of inspection light from the ball inspection unit intersects the aforementioned longitudinal directions substantially perpendicularly.

12 Claims, 3 Drawing Sheets

BALL MOUNT APPARATUS AND MOUNT METHOD

BACKGROUND OF THE INVENTION

1. Field of the Invention

The present invention relates to improvement of a ball mount apparatus and a mount method for mounting solder balls, solder bumps, or the like, on a work such as a substrate, a frame, or the like, and particularly relates to a ball mount apparatus and a mount method which are improved in inspection of surplus balls or an error in ball sucking, and balls left due to a mounting error after mounting balls.

The present application is based on Japanese Patent Application No. Hei. 11-220729, which is incorporated herein by reference.

2. Description of the Related Art

In the background art, there is known a ball mount apparatus having a ball supply portion and a work positioning portion (a position where solder balls are mounted on a work) and reciprocating between these portions so as to mount solder balls on a positioned work. In such a ball mount apparatus, a ball inspection unit is provided for making inspection as to whether there is an error in ball sucking or not, while a mount head moves relatively between the ball supply portion and the work positioning portion.

In such a ball mount apparatus, generally, the longitudinal direction of a work is regarded as an X-axis, and the relative moving direction of the mount head from a ball suction position to a ball mount position is regarded as a Y-axis. This is because the dimension of a mount head along the relative moving axis (Y-axis) is reduced so as to miniaturize the ball mount apparatus. Further, a ball inspection unit has a light emission portion and a light reception portion disposed in a direction perpendicular to a relative moving course of the mount head, that is, in the longitudinal direction of the work. Thus, the ball inspection unit is disposed on the relative moving course (on Y-axis) of the mount head.

The ball inspection unit makes the mount head move over a laser sensor relatively, so that the light reception portion receives laser light projected from the light emission portion to thereby detect surplus balls, an error in sucking balls, and residual balls.

Recently, however, with the increase of the area of a work to which balls are mounted in a lump, the distance between the light emission portion and the light reception portion in the inspection unit is increased. Thus, the inspection accuracy is lowered due to diffusion of light. Further, with the miniaturization of balls, the inspection accuracy is required to be too high for the background art to cope with.

SUMMARY OF THE INVENTION

It is an object of the present invention to provide a ball mount apparatus and a mount method in which, in order to solve the foregoing problems, a ball inspection unit makes inspection in the lateral direction of a work so that the distance between a light emission portion and a light reception portion in the ball inspection unit is reduced, whereby the inspection accuracy is prevented from lowering, and increasing in size of the unit can be avoided.

In order to attain the foregoing object, the present invention provides a ball mount apparatus which comprises: a work conveying path provided in a longitudinal direction of a work on which balls are to be mounted; a ball supply tray for supplying balls, the ball supply tray being disposed so that a longitudinal direction thereof substantially coincides with that of the work; a mount head disposed so that a longitudinal direction thereof substantially coincides with that of the work; and a ball inspection unit for inspecting ball-suction by the mount head, the ball inspection unit being disposed so that a projecting direction of inspection light from the ball inspection unit intersects the longitudinal directions substantially perpendicularly; and further provides a mount method using the ball mount apparatus.

Features and advantages of the invention will be evident from the following detailed description of the preferred embodiments described in conjunction with the attached drawings.

DETAILED DESCRIPTION OF THE PREFERRED EMBODIMENTS

Figure 1:
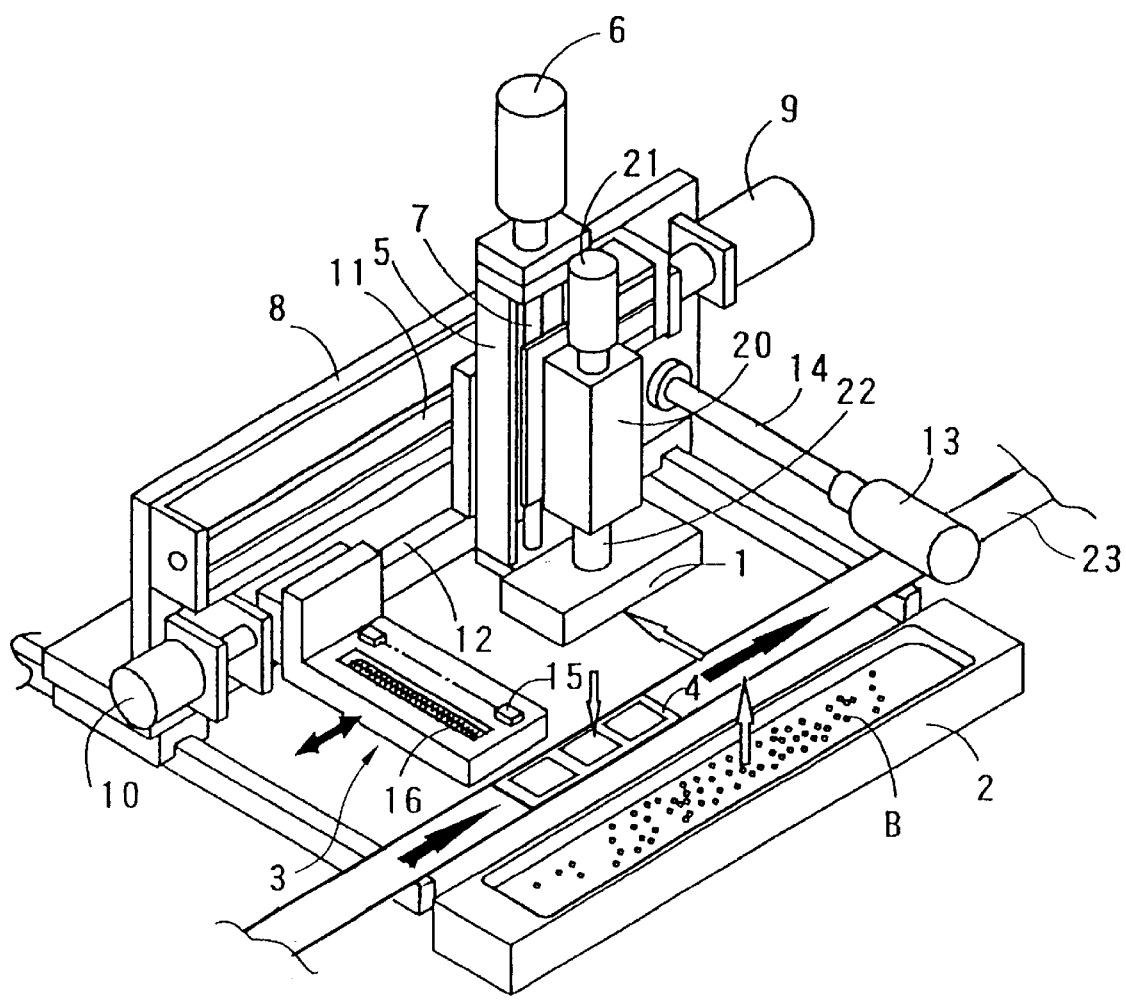
FIG. 1 shows a perspective view of a solder ball mount apparatus.
Figure 2:
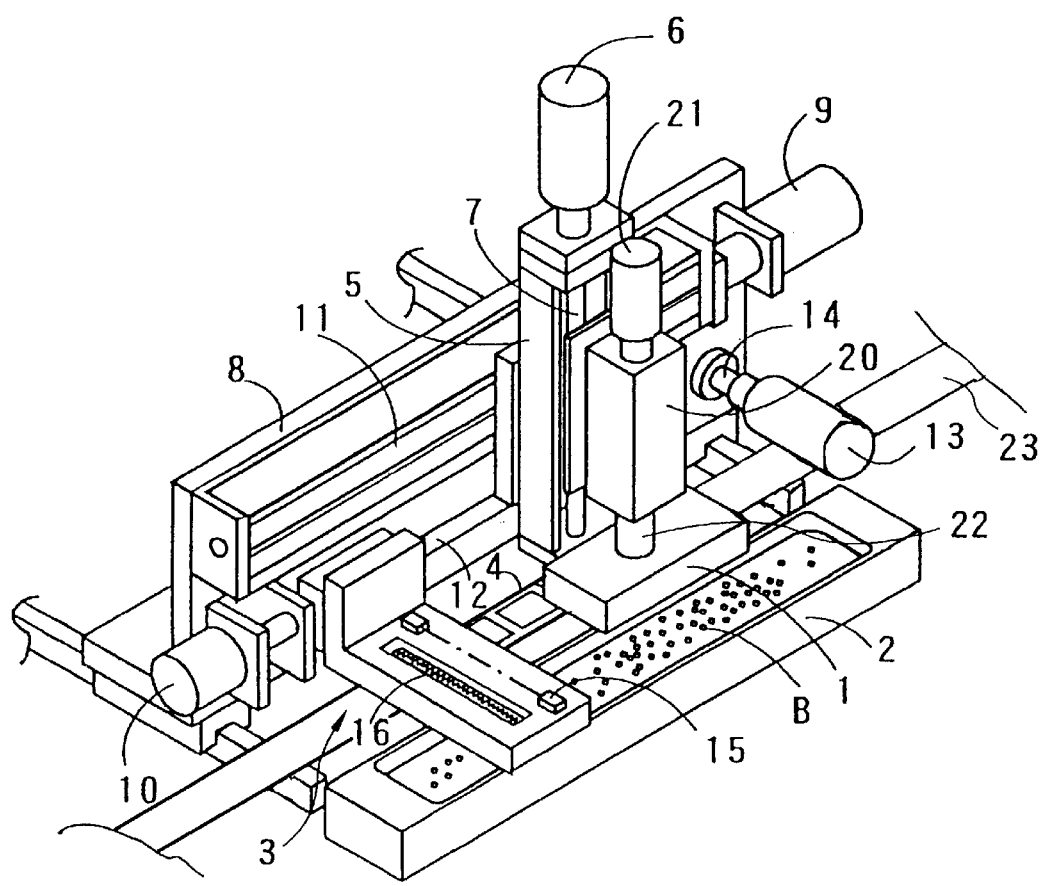
FIG. 2 shows a perspective view of the same apparatus in a state where a mount head is located on a ball supply tray.
Figure 3:
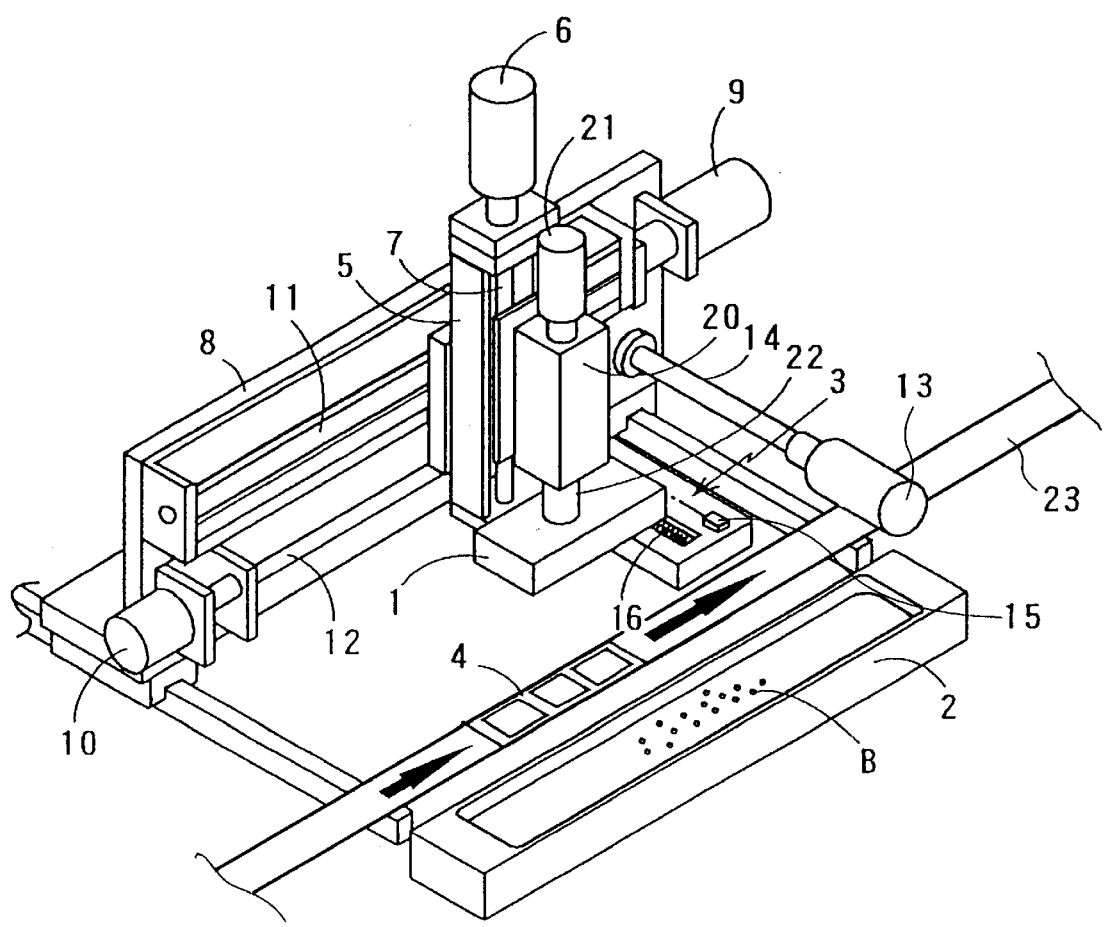
FIG. 3 shows a perspective view of the same apparatus in a state where the mount head is located on a mount position.

Description will be made below about the mode for carrying out the invention along with its embodiment with reference to the drawings. FIG. 1 is a perspective view schematically showing a solder ball mount apparatus in which the present invention is carried out. FIG. 2 shows a state where a mount head is located on a ball supply tray, and FIG. 3 shows a state where the mount head is located on a mount position.

The solder ball mount apparatus of the embodiment is constituted by a work conveying path 23, a mount head 1, a driving mechanism for driving the mount head 1, a ball supply tray 2 acting as a ball supply portion, a ball inspection unit 3 disposed between the mount head 1 and the ball supply tray 2, and another driving mechanism for driving the ball inspection unit 3.

The work conveying path 23 is provided to run in the longitudinal direction of a work 4 on which solder balls are to be mounted. The direction indicated by an arrow in the vicinity of a work 4 in FIG. 1 is the direction of a work conveying axis, along which the work 4 moves. Incidentally, in FIG. 1, the place where the work 4 is located is a position where solder balls are to be mounted on the work 4, that is, a work positioning portion.

The ball supply tray 2 in which a large number of solder balls B are reserved is used as the ball supply portion. The ball supply tray 2 is disposed so that the longitudinal direction of the ball supply tray 2 substantially coincides with the longitudinal direction of the work 4. In this embodiment, the ball supply tray 2 is at a standstill and hence it does not move.

The mount head 1 moves relatively in a Y-axis direction between the ball supply tray 2 of the ball supply portion and the work positioning portion where solder balls are to be mounted. There are two cases where the mount head 1 moves relatively in the Y-axis direction. That is, one is the case where the mount head 1 itself moves while the ball supply tray 2 and the work positioning portion are left at a standstill, and the other is the case where the ball supply tray 2 and optionally the work positioning portion move in the Y-axis direction under the mount head 1 while the mount head 1 does not move in the Y-axis direction. In this embodiment, the former is adopted so that the mount head 1 moves.

The mount head 1 is attached to a Z-axis base 5 so that it is moveable up and down and so that the longitudinal direction of the mount head 1 substantially coincides with the longitudinal direction of the work 4. The Z-axis base 5 has a Z-axis motor 6 and a ball screw 7 connected thereto. The Z-axis base 5 is attached to an X-axis base 8 so as to be movable in an X-axis direction. Incidentally, in the drawing, the reference numeral 20 represents a Θ-axis base which has a Θ-axis motor 21 and a ball screw 22. This Θ-axis driving mechanism is used for adjusting the rotation angle of the work 4 and the mount head 1 in the horizontal plane at the work positioning portion.

The X-axis base 8 is provided with an X-axis motor 9 and an X'-axis motor 10 with which ball screws 11 and 12 are connected respectively. A ball inspection unit 3 is connected with the ball screw 12 of the X'-axis motor 10 The ball screw 12 connected with the X'-axis motor 10 acts as a ball inspection unit relative moving axis. The ball inspection unit relative moving axis is provided substantially in parallel with the work conveying axis. Although this embodiment adopts a system in which the ball inspection unit moves, it will go well so long as the ball inspection unit moves relatively. It is therefore possible to adopt a system in which the ball inspection unit 3. is at a standstill while the mount head 1 is moved over the ball inspection unit 3 by the X-axis motor 9.

A Y-axis motor 13 and a ball screw 14 allow the X-axis base 8 to move between the ball supply tray 2 of the ball supply portion and the work positioning portion where solder balls are to be mounted. Thus, the mount head 1 is made moveable between the ball supply tray 2 of the ball supply portion and the work positioning portion. The ball screw 14 connected with the Y-axis motor 13 acts as a head relative moving axis when the mount head 1 moves from the ball suction to the ball mounting. The head relative moving axis intersects the work conveying axis and the ball inspection unit relative moving axis substantially perpendicularly to each other.

In the ball inspection unit 3, a laser sensor 15 is disposed so that the projecting direction of inspection light intersects the longitudinal direction of the work 4 substantially perpendicularly. Further, light sources 16 for detecting suction errors are disposed in parallel with the projecting direction of inspection light.

Description will be made below about the procedure to operate the solder ball mount apparatus according to this embodiment. First, the Y-axis motor 13 drives the mount head 1 so that the mount head 1 moves to above the ball supply tray 2 along the ball screw 14, as shown in FIG. 2. As soon as a work is supplied to the work positioning portion, the mount head 1 moves from above the ball supply tray 2 of the ball supply portion down to the ball supply position along the ball screw 7 so as to suck solder balls on its lower surface. After sucking the solder balls, the mount head 1 moves up by virtue of the reverse rotation of the Z-axis motor 6, and begins to move to above the work positioning portion by virtue of the Y-axis motor 13. It will go well so long as the mount head 1 moves in the Y-axis direction relatively to the ball supply tray 2 and the work positioning position. Therefore, the configuration may be such that the mount head 1 is at a standstill, and the ball supply tray 2 and optionally the work positioning position may move in the Y-axis direction under the mount head 1.

While the mount head 1 moves relatively as mentioned above, the X'-axis motor 10 drives the ball inspection unit 3 attached to the X-axis base 8 so that the unit 3 moves in the direction perpendicular to the moving direction of the mount head 1 along the ball screw 12. At this time, the ball inspection unit 3 projects inspection light in the direction perpendicular to the longitudinal direction of the mount head 1 so as to scan and inspect the lower surface of the mount head 1 whether there are surplus balls or errors in sucking balls or not. FIG. 3 shows a state where the ball inspection unit 3 has completed the movement for the aforementioned inspection. It will go well so long as the ball inspection unit moves relatively to the mount head 1. Therefore, without using the X'-axis motor 10 for driving the ball inspection unit, the mount head 1 may be moved for inspection by use of the X-axis motor 9 for driving the mount head 1.

If there are not any surplus balls or not any errors in sucking balls, the mount head 1 completes its movement to above the work positioning portion as soon as termination of the inspection. The posture of the work 4 is recognized by a not-shown CCD camera, and the posture of the mount head 1 is corrected. Then, the mount head 1 begins to move down by virtue of the Z-axis motor 6, and mounts solder balls on the work 4.

After mounting the balls, the mount head 1 moves up and begins to move to the ball supply tray 2 of the ball supply portion. At this time, the X'-axis motor 10 is rotated reversely, and the ball inspection unit 3 projects inspection light again in the direction perpendicular to the longitudinal direction of the mount head 1 so as to scan and inspect the lower surface of the mount head 1 whether there are errors in mounting solder balls or not (whether there are residual balls on the mount head 1 or not).

When there are errors in ball sucking, and if the errors are missing balls, the mount head 1 moves to the ball supply tray 2 again, and repeats the ball sucking operation. If there are surplus balls, on the contrary, the mount head 1 discharges all the sucked balls into a not-shown ball discharge unit, then moves to the ball supply tray 2 again and repeats the ball sucking operation.

According to the present invention, the work conveying path is provided in the longitudinal direction of a work on which balls are to be mounted, the ball supply tray for supplying balls and the mount head are disposed so that their longitudinal directions substantially coincide with the longitudinal direction of the work, and the ball inspection unit for inspecting balls sucked on the mount head is disposed so that the projecting direction of inspection light from the ball inspection unit intersects the above-mentioned longitudinal directions substantially perpendicularly so as to perform ball inspection in the lateral direction of the work. It is therefore possible to perform stable inspection independently of the longitudinal length of the work.

Since inspection can be performed in the lateral direction of the work, the distance between a light emission portion and a light reception portion in the inspection unit can be reduced so that the inspection accuracy can be prevented from lowering. In addition, since the apparatus arrangement can be made as usual, increasing in size of the apparatus can be avoided.

Further, if the ball inspection can be achieved during the Y-axis relative movement of the mount head, there is no tact loss, and it is not necessary to locate the ball inspection unit on the course of the Y-axis relative movement. It is therefore possible to shorten the Y-axis stroke, so that it is possible to enhance the tact time.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A ball mount apparatus comprising:
    a work conveying path having a work conveying axis provided along a longitudinal direction of a work;
    a ball inspection unit having a first relative moving axis being provided substantially in parallel with said work conveying axis; and
    a mount head having a second relative moving axis in which said mount head moves from a ball suction position to a ball mount position,
    wherein said second relative moving axis is made to intersect each of said work conveying axis and said first relative moving axis substantially perpendicularly so that a projecting direction of inspection light from said ball inspection unit inspects ball suction on a surface of said mount head and intersects said longitudinal direction of said work substantially perpendicularly.

2. The ball mount apparatus of claim 1, wherein said ball inspection unit further includes additional light sources which are disposed in parallel with the projection direction of the inspection light.

3. The ball mount apparatus of claim 1, wherein the surface of said mount head that is inspected is a lower surface.

4. The ball mount apparatus of claim 1, wherein said mount head and said ball inspection unit are relatively moavable in the longitudial direction of the work, and are integrally movable in a direction substantially perpendicular intersecting with the longitudial direction.

5. A ball mount apparatus comprising:
    a work conveying path provided in a longitudinal direction of a work on which balls are to be mounted;
    a ball supply tray for supplying balls, said ball supply tray being disposed so that a longitudinal direction thereof substantially coincides with that of said work;
    a mount head disposed so that a longitudinal direction thereof substantially coincides with that of said work; and
    means for inspecting ball-suction on a surface of said mount head, said means for inspecting ball-suction being disposed so that a projecting direction of inspection light of said means for inspecting ball-suction intersects said longitudinal directions substantially perpendicularly.

6. The ball mount apparatus of claim 5, wherein said means for inspecting ball-suction further includes additional light sources which are disposed in parallel with the projection direction of the inspection light.

7. The ball mount apparatus of claim 5, wherein said mount head and said means for inspecting ball-suction are relatively movable in the longitudinal direction of the work, and are integrally movable in a direction substantially perpendicularly intersecting with the longitudinal direction.

8. The ball mount apparatus of claim 5, wherein the surface of said mount head that is inspected is a lower surface.

9. A ball mount apparatus comprising:
    a work conveying path provided in a longitudinal direction of a work on which balls are to be mounted;
    a ball supply tray for supplying balls, said ball supply tray being disposed so that a longitudinal direction thereof substantially coincides with that of said work;
    a mount head disposed so that a longitudinal direction thereof substantially coincides with that of said work; and
    a ball inspection unit which is operative to inspect a surface of said mount head for ball-suction, said ball inspection unit being disposed so that a projecting direction of inspection light from said ball inspection unit intersects said longitudinal directions substantially perpendicularly,
    wherein said ball inspection unit further includes additional light sources which are disposed in parallel with the projection direction of the inspection light.

10. The ball mount apparatus of claim 9, wherein the surface of said mount head that is inspected is a lower surface.

11. A ball mount apparatus comprising:
    a work conveying path provided in a longitudinal direction of a work on which balls are to be mounted;
    a ball supply tray for supplying balls, said ball supply tray being disposed so that a longitudinal direction thereof substantially coincides with that of said work;
    a mount head disposed so that a longitudinal direction thereof substantially coincides with that of said work; and
    a ball inspection unit which is operative to inspect a surface of said mount head for ball-suction, said ball inspection unit being disposed so that a projecting direction of inspection light from said ball inspection unit intersects said longitudinal directions substantially perpendicularly,
    wherein said mount head and said ball inspection unit are relatively movable in the longitudinal direction of the work, and are integrally movable in a direction substantially perpendicularly intersecting with the longitudinal direction.

12. The ball mount apparatus of claim 11, wherein the surface of said mount head that is inspected is a lower surface.

* * * * *